(12) United States Patent
Kim

(10) Patent No.: US 6,400,420 B1
(45) Date of Patent: Jun. 4, 2002

(54) AUTOMATIC FINE TUNING APPARATUS IN DIGITAL TELEVISION RECEIVER

(75) Inventor: Ung-jung Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/473,024

(22) Filed: Dec. 28, 1999

(30) Foreign Application Priority Data

Dec. 28, 1998 (KR) ............................................. 98-59416

(51) Int. Cl.[7] .................................................. H04N 5/50
(52) U.S. Cl. ....................................... 348/731; 348/735
(58) Field of Search ................................. 348/735, 731, 348/732, 733, 536, 725; H02N 5/50, 5/44

(56) References Cited

U.S. PATENT DOCUMENTS 6,084,645 A * 7/2000 Park et al. .................. 348/731

* cited by examiner

Primary Examiner—Sherrie Hsia
(74) Attorney, Agent, or Firm—Robert E. Bushnell, Esq.

(57) ABSTRACT

A fine tuning apparatus in a digital television receiver, including a tuner including first and second local oscillators, a channel decoder for outputting an error value with respect to the degree of frequency deviation of an RF signal from its regular frequency band, the RF signal being tuned by a tuner, and a microprocessor for receiving an error value output from the channel decoder and controlling the second local oscillator in the tuner to reduce the error value. Thus, fine control can be made regardless of a predetermined fine control range in a field which uses a digital television.

8 Claims, 4 Drawing Sheets

AUTOMATIC FINE TUNING APPARATUS IN DIGITAL TELEVISION RECEIVER

CLAIM OF PRIORITY

This application makes reference to, incorporates the same herein, and claims all benefits accruing under 35 U.S.C §119 from an application entitled Automatic Fine Tuning Apparatus In Digital Television Receiver earlier filed in the Korean Industrial Property Office on Dec. 28, 1998, and there duly assigned Serial No. 98-59416 by that Office, a certified copy of which application is attached hereto.

BACKGROUND OF THE INVENTION

1. Field of the Invention

The present invention relates to a digital television reception and receivers, and, more particularly, to an automatic fine tuning process and apparatus for a digital television receiver.

2. Description of the Related Art

In a digital television broadcast, signals transmitted from a broadcast station to a television receiver as well as the signals within a television receiver are all digital signals, so that more distinct pictures and clearer sounds are provided than those in an analog television broadcast. Digital television receivers provide images of eighteen formats, the receivers ranging from a standard television (SDTV) receiver having a 640×480 resolution, the same as that of an existing analog NTSC television receiver, to a high definition television (HDTV) receiver having a 1920×1080 resolution, which is seven times larger than that of the SDTV receiver. Digital television receivers vividly reproduce clear stereophonic sounds that exceed those reproduced from compact disks (CD), by adopting a Dolby AC-3 system. Also, digital television receivers use a technique of compressing data by a ratio of 50 to 1 or more, so that the number of channels broadcast by a broadcast station is substantially increased in comparison to the number of channels broadcast by a SDTV broadcast station. Moreover, digital television receivers can achieve interactive transmission, thus providing totally different services in addition to those provided by existing analog television receivers.

An exemplary digital television receiver may be constructed with a tuner feeding an intermediate frequency module. The tuner tunes to one radio frequency channel among the several broadcast signals received via an antenna, under the control of a microprocessor. An intermediate frequency stage module receives an IF signal from the tuner and converts that signal into a baseband signal while a channel decoder produces a data bitstream by decoding the baseband signal output from the intermediate frequency stage module. A TS decoder then separates audio data, video data and additional data from the data bitstream output by the channel decoder.

Digital television receivers receives the various radio frequency signals either through the atmosphere or via a cable like an analog signal broadcast. A radio frequency tuner that is first tuned under the control of a microprocessor exhibits a frequency deviation from its regular frequency band as it passes through several intermediate apparatuses. Accordingly, an automatic fine tuning (AFT) apparatus is required to finely control the RF frequency. We have noticed however, that with conventional automatic fine tuning stages, a channel decoder is able to control variation of the frequency by the second local oscillator to within a range of about ±250 khz. This unfortunately, is, in our opinion, unacceptable because we have found that fine tuning of an error value outside of this restricted control range is not feasible.

SUMMARY OF THE INVENTION

It is therefore, one object of the present invention to provide an improved automatic fine tuning process and circuit.

It is another object to provide an automatic fine tuning apparatus capable of fine tuning an error value free a restriction on a predetermined range of frequency.

It is still another object to provide an automatic fine tuning process and circuit able to provide a digital receiver with fine tuning of broadcast signals over a wider range of frequency deviations.

Accordingly, to achieve these and other objects, there is provided a fine tuning apparatus in a digital television receiver with a tuner including first and second local oscillators; a channel decoder outputting an error value with respect to the frequency deviation of an RF signal, which is tuned by the tuner, from the expected baseband signal; and a microprocessor receiving an error value output from the channel decoder and controlling the second local oscillator in the tuner to reduce the error value.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DESCRIPTION OF THE PREFERRED EMBODIMENTS

Figure 1:
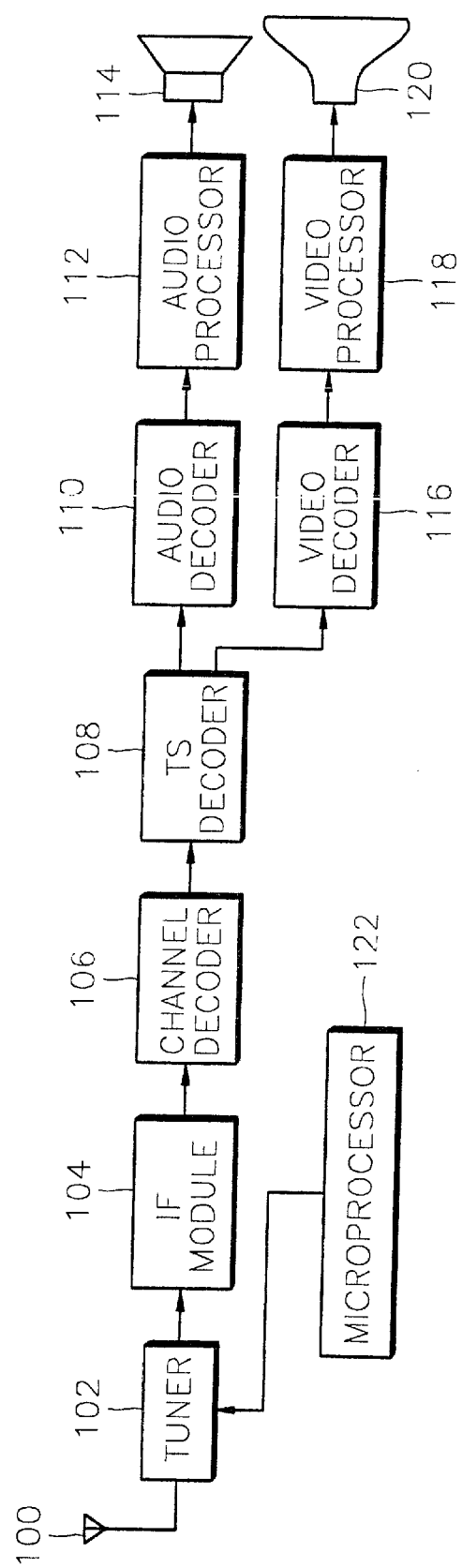
FIG. 1 is a block diagram of an exemplary digital television receiver.

Turning now to the drawings, FIG. 1 illustrates, in block diagram forms, one configuration of an exemplary digital television receiver constructed with antenna 100, tuner 102, intermediate frequency (IF) module 104, channel decoder 106, transport stream (TS) decoder 108, audio decoder 110, audio processor 112, speaker 114, video decoder 116, video processor 118, a variable visual video display such as. by way of example, cathode ray tube (CRT) 120, and microprocessor 122. Tuner 102 tunes to one radio frequency (RF) channel among the various broadcast signals received via antenna 100, under the control of microprocessor 122. IF module 104 receives an intermediate frequency (i.e., an IF) signal from tuner 102 and converts it into a baseband signal. Channel decoder 106 channel-decodes the baseband signal output from IF module 104, and reproduces a data bitstream. TS decoder 108 separates audio data, video data and additional data from the data bitstream output from channel decoder 106. Audio decoder 110 receives the audio data and decodes the audio data according to an MPEG (i. e., the Moving Picture Experts Group) standard or the Dolby AC-3 standard. Audio processor 112 outputs an audio signal decoded by audio decoder 110 to speaker 114. Video decoder 116 receives the video data and decodes the video data according to the MPEG standard. Video processor 118 outputs a video signal decoded by video decoder 116 to CRT 120.

The digital television receiver receives radio frequency (i.e., RF) signals through the air or via a cable as in an analog broadcast. An RF first tuned under the control of microprocessor 122 obtains a frequency deviation from its regular frequency band as it passes through several intermediate apparatuses. Accordingly, an automatic fine tuning (AFT) apparatus is required to finely control the RF frequency.

Figure 2:
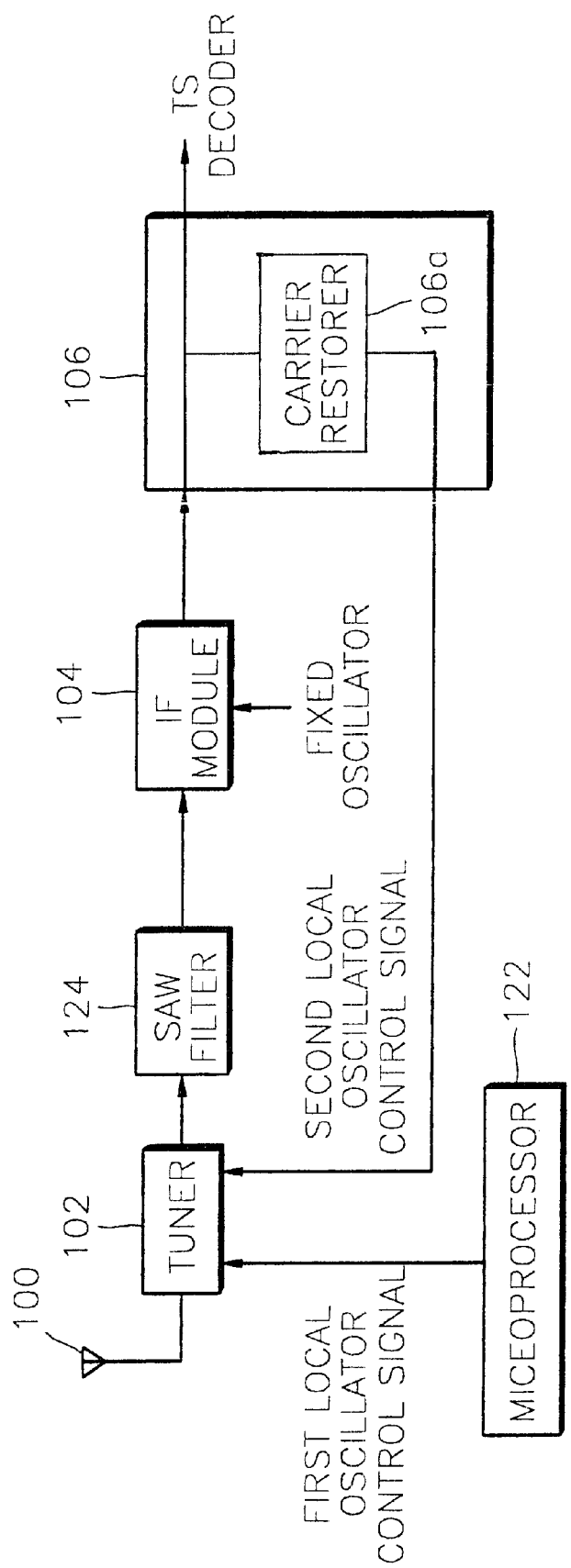
FIG. 2 is a block diagram of an example of an automatic fine tuning apparatus.

FIG. 2 is a block diagram showing the configuration of an example of an AFT apparatus adopting a frequency phase locked loop (i.e., a FPLL). Blocks in FIG. 2 having substantially the same functions as those in FIG. 1 are indicated by the same reference numerals. The apparatus in FIG. 2 includes an antenna 100, a tuner 102, an IF module 104, a channel decoder 106, a microprocessor 122 and a surface acoustic wave (SAW) filter 124. SAW filter 124 planarizes the characteristics of an IF frequency output from tuner 102. Tuner 102, although not shown, may be constructed with an RF amplification circuit, a mixed circuit and a local oscillation circuit, and selects a desired frequency under the control of microprocessor 122 and simultaneously amplifies the selected frequency and then converts the resultant frequency into an IF frequency. Tuner 102 of FIG. 2 includes, but not shown, a first local oscillator for first tuning and a second local oscillator for fine tuning.

In the operation of the AFT apparatus of FIG. 2, microprocessor 122 controls the first local oscillation circuit of tuner 102, so that an RF signal is tuned first. The second local oscillator in tuner 102 fine tunes the output of the first local oscillation circuit. The fine tuned RF signal is planarized by SAW filter 124, converted into a baseband signal by IF module 104, and then provided to channel decoder 106. A carrier restorer 106a in channel decoder 106 outputs an error value corresponding to the amount of frequency deviation of the RF signal from the expected received baseband signal. At this time, channel decoder 106 controls the second local oscillator in tuner 102 to reduce the error value output from carrier restorer 106a in channel decoder 106. We have noticed that with AFT apparatus of the type described in the preceding paragraphs, the channel decoder can control the second local oscillator to within a range of about ±250 khz; consequently fine tuning of an error value departing from this restricted control range is impossible.

Figure 3:
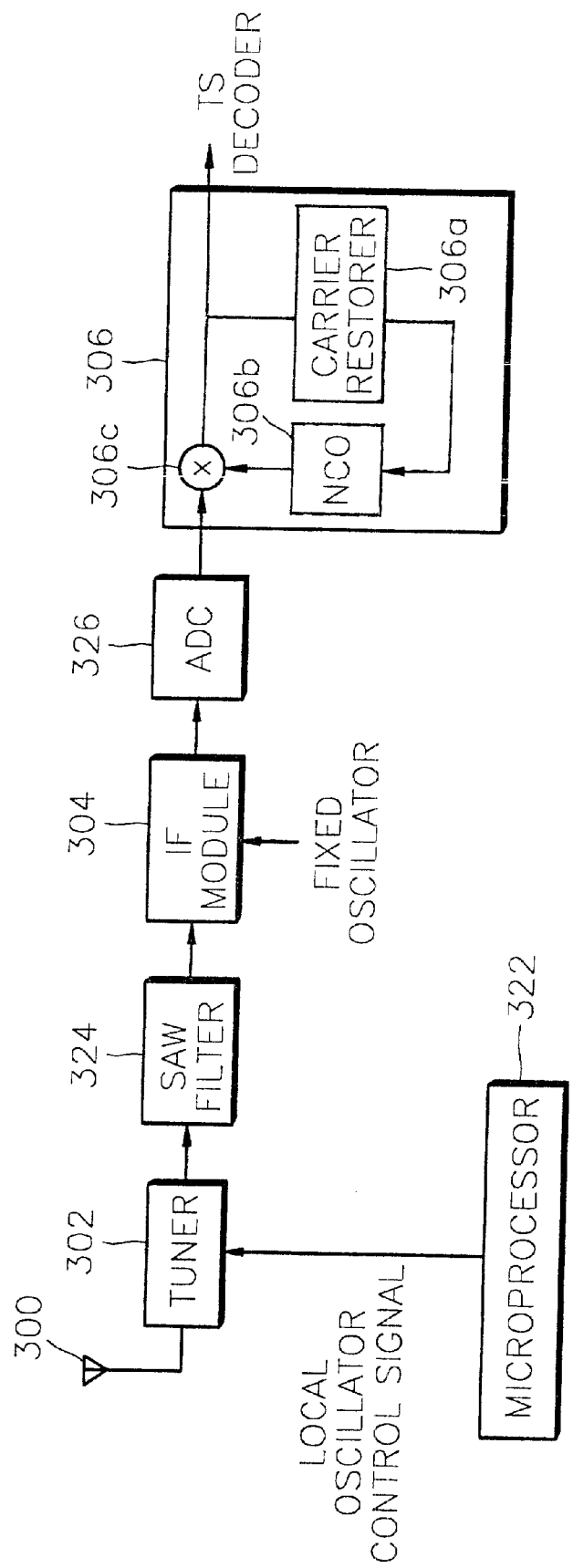
FIG. 3 is a block diagram of an example of an automatic fine tuning apparatus constructed according to the principles of the present invention.

FIG. 3 shows an automatic fine tuning apparatus constructed according to the principles of the present invention which adopts a digital frequency phase locked loop (DFPLL) circuit. The apparatus of FIG. 3 includes antenna 300, tuner 302, intermediate frequency (IF) module 304, channel decoder 306, microprocessor 322, surface acoustic wave (SAW) filter 324, and analog-to-digital converter (ADC) 326. The channel decoder 306 includes a carrier restorer 306a, numerically controlled oscillator (NCO) 306b, and mixer 306c. The microprocessor 122 controls a first local oscillator in the tuner 102, so that the tuner 102 tunes a first RF frequency.

Then, the SAW filter 324 planarizes the tuned RF signal. The IF module 304 converts a received frequency signal into a baseband signal. The ADC 326 converts a received baseband signal into a digital signal and outputs the digital signal to the channel decoder 306. The carrier restorer 306a in the channel decoder 306 outputs an error value corresponding to the frequency deviation of an RF frequency from the an expected baseband signal. The error value output from the carrier restorer 306a is provided to the NCO 306b, and the NCO 306b converts an oscillation frequency to reduce the received error value. The mixer 306c mixes the oscillation frequency output from the NCO 306b with the digital baseband signal. In this case, fine tuning is accomplished by the oscillation frequency of the NCO 306b in the channel decoder 306.

Figure 4:
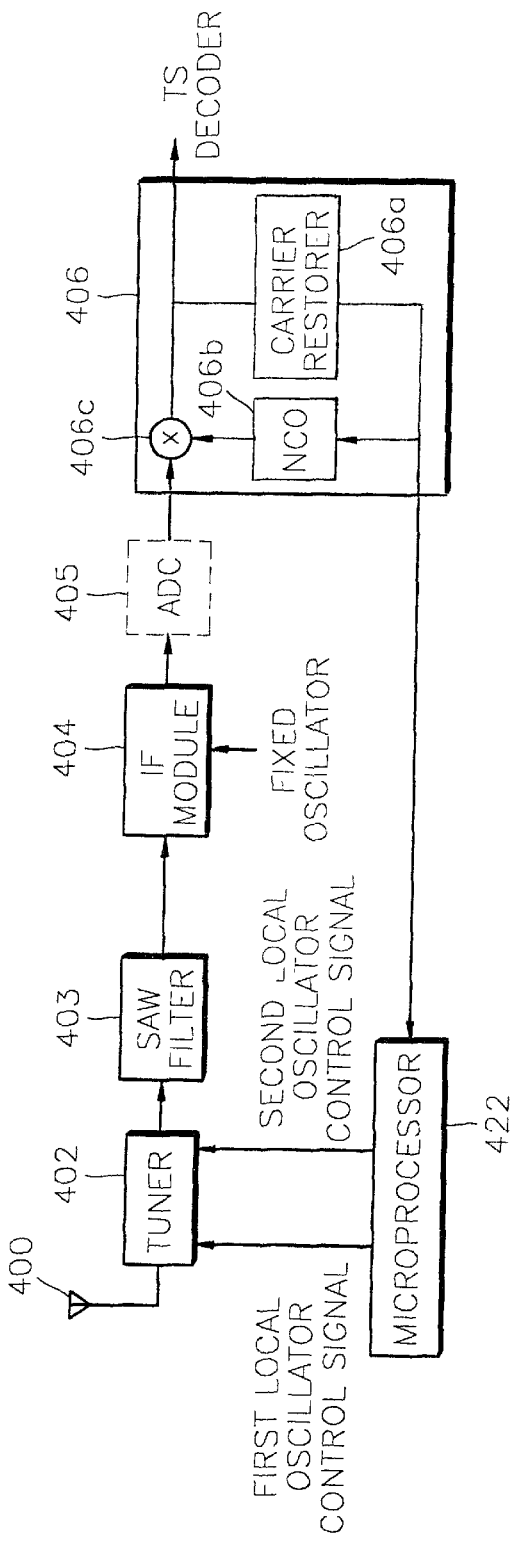
FIG. 4 is a block diagram of another example of an automatic fine tuning apparatus according to the present invention.

FIG. 4 shows another example of an AFT apparatus in a digital television receiver according to the present invention. This example includes both the DFPLL described with reference to FIG. 3, and a frequency phase locked loop FPLL. The apparatus of FIG. 4 may be constructed with antenna 400, tuner 402, SAW filter 403, IF module 404, ADC 405, channel decoder 406 and microprocessor 422. Tuner 402 includes first and second local oscillators which operate according to a first and second local oscillator control signals, respectively, which are from the microprocessor 422, and tunes to a corresponding frequency. SAW filter 403 planarizes the characteristics of an IF signal output from tuner 402. IF module 404 receives an IF signal output from tuner 402 and converts it into a baseband signal. ADC 405 converts a received signal into a digital signal when the DFPLL is adopted.

In the operation of the apparatus of FIG. 4, when the FPLL is adopted, the microprocessor 422 controls the first local oscillator of the tuner 402, so that the tuner 402 tunes to a first RF frequency. The tuned RF signal is planarized by the SAW filter 403, converted into a baseband signal by the IF module 404, and output to the channel decoder 406. A carrier restorer 406a in the channel decoder outputs an error value corresponding to the frequency deviation of the RF frequency from an expected baseband signal. The error value is provided to the microprocessor 422. The microprocessor 422 performs fine control for controlling the second local oscillator in the tuner 402 to reduce the received error value.

Meanwhile, when the DFPLL is adopted, the carrier restorer 406a, an NCO 406b and a mixer 406c in the channel decoder 406 operate. The microprocessor 422 controls the first local oscillator in the tuner 402, so that the tuner 402 tunes to a first RF frequency. The tuned RF frequency signal is planarized by the SAW filter 403, converted into a baseband signal having an offset by the IF module 404, converted into a digital signal by the ADC 405, and output to the channel decoder 406. Primarily, the error value output from the carrier restorer 406a is provided to the NCO 406b, and the NCO 406b generates an oscillation frequency to reduce the error value. At this time, the microprocessor 422, which has been monitoring the information on the lock state of the channel decoder 406, starts controlling the second local oscillator in the tuner 402 to reduce the error value when an error which is hard to be solved exists in the NCO 406b.

Figure 5:
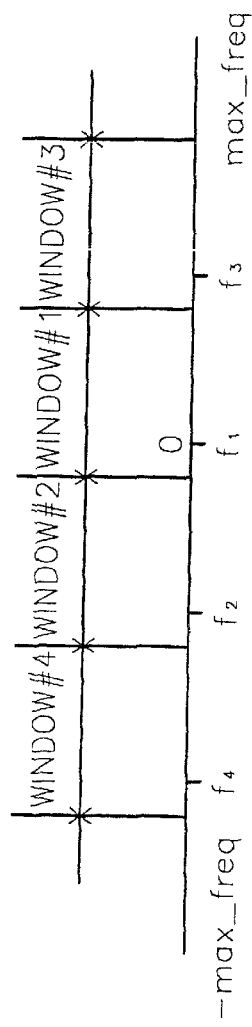
FIG. 5 shows a window generated according to a frequency offset in the practice of the present invention.

A method of tuning to an RF frequency by applying a frequency offset when the DFPLL is adopted will now be described in detail with reference to FIG. 5. When an RF signal is received, a maximum possible frequency deviation is set as max_freq, and several windows as shown in FIG. 5 can be set on the basis of a position where a frequency offset is zero. Here, the size of each window must be within the (D)FPLL lock range of a channel chip.

When a first frequency is tuned, a determination is made as to whether a carrier lock signal of a channel chip set is active while synthesizer frequencies in the tuner are sequentially converted into reference frequencies f1, f2, f3, . . . of respective windows. When the first determination process is completed in this way, only carrier lock in one window or two adjacent windows is activated in a fine tuning application frequency band.

Referring to the maximum and minimum frequencies within one detected window section or two detected window sections as w_max and w_min, a synthesizer frequency is set as a frequency which is the closest to w_min. Accordingly, while the microprocessor 422 is controlled to increase the frequency of the second local oscillator in the tuner on a step-by-step basis, the error value output from the carrier restorer 406b in the channel decoder 406 is read. When the error value is similar to an error value at a second IF frequency upon normal tuning, it is considered to have been finely controlled.

In the practice of the principles of the present invention with the embodiments described in the foregoing paragraphs, fine control of frequency may be achieved regardless of a predetermined fine control range.

What is claimed is:

1. A fine tuning apparatus in a digital television receiver, comprising:
   a tuner including first and second local oscillators;
   a channel decoder for outputting an error value with respect to a degree of frequency deviation of an RF (radio-frequency) signal from an expected baseband signal, said RF signal being output from the first local oscillator in the tuner; and
   a microprocessor for receiving an error value output from the channel decoder and controlling the second local oscillator in the tuner to reduce the error value.

2. The fine tuning apparatus of claim 1, wherein the channel decoder comprises; a carrier restorer for outputting the error value with respect to the frequency deviation of the RF signal;
   a numerical control oscillator generating an oscillation signal by oscillating, in response to the error value output from the carrier restorer, at a digital frequency to reduce said error value; and
   a mixer for mixing a digital baseband signal with the oscillation signal output from the numerical control oscillator.

3. The fine tuning apparatus of claim 2, wherein said channel decoder forms a digital frequency phase locked loop (DFPLL). said DFPLL being primarily utilized to reduce said error value, and said microprocessor receives said error value output from the channel decoder and controls said second local oscillator in the tuner to reduce the error value when said error value is not sufficiently reduced by said DFPLL.

4. The fine tuning apparatus of claim 2, wherein said microprocessor receives said error value output from the channel decoder and controls said second local oscillator in the tuner to reduce the error value when said error value is not sufficiently reduced by said numerical control oscillator.

5. A fine tuning apparatus in a digital television receiver, comprising:
   a tuner including a first local oscillator;
   a channel decoder for outputting an error value with respect to a degree of frequency deviation of an RF (radio-frequency) signal from an expected baseband signal, said RF signal being output from the first local oscillator in the tuner, said channel decoder forming a digital frequency phase lock loop (DFPLL) comprised of:
      a carrier restorer for outputting the error value with respect to the frequency deviation of the RF signal;
      a numerical control oscillator generating an oscillation signal by oscillating, in response to the error value output from the carrier restorer, at a digital frequency to reduce said error value; and
      a mixer for mixing a digital baseband signal with the oscillation signal output from the numerical control oscillator; and
   a microprocessor for controlling the first local oscillator in the tuner to output said RF signal.

6. The fine tuning apparatus as set forth in claim 5, further comprising a second local oscillator receiving said RF signal from said first local oscillator, said second oscillator being controlled by said microprocessor, in response to said error value output from the carrier restorer, to reduce the error value when said error value is not sufficiently reduced by said DFPLL.

7. The fine tuning apparatus as set forth in claim 6, further comprising:
   a surface acoustic wave (SAW) filter for planarizing an output of said second local oscillator; and
   a intermediate frequency (IF) module for receiving an output of said SAW filter for converting said RF signal into a received baseband signal, said received baseband signal being provided to said mixer of said channel decoder.

8. The fine tuning apparatus as set forth in claim 6, further comprising:
   a surface acoustic wave (SAW) filter for planarizing an output of said second local oscillator; and
   a intermediate frequency (IF) module for receiving an output of said SAW filter for converting said RF signal into a received baseband signal; and
   an analog to digital converter for converting said received baseband signal to a digital baseband signal, said digital baseband signal being provided to said mixer of said channel decoder.

* * * * *